United States Patent
Saho (10) Patent No.: US 7,731,034 B2
(45) Date of Patent: Jun. 8, 2010

(54) ELECTRONIC PART SUPPLYING TAPE AND ELECTRONIC PART SUPPLYING TAPE CONNECTING METHOD

(75) Inventor: Hidehiro Saho, Saga-ken (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/705,344

(22) Filed: Nov. 10, 2003

(65) Prior Publication Data

US 2004/0094451 A1 May 20, 2004

(30) Foreign Application Priority Data

Nov. 15, 2002 (JP) .............................. 2002-331885

(51) Int. Cl.
*B65D 85/00* (2006.01)
(52) U.S. Cl. ..................... 206/717; 206/390; 206/716; 206/820
(58) Field of Classification Search ......... 206/713–717, 206/820, 390
See application file for complete search history.

(56) References Cited

U.S. PATENT DOCUMENTS

| | | | | |
|---|---|---|---|---|
| 3,241,658 A | * | 3/1966 | Anderson | 206/390 |
| 3,311,229 A | * | 3/1967 | Troll et. al. | 206/390 |
| 3,414,123 A | * | 12/1968 | Litt et. al. | 206/820 |
| 3,431,548 A | * | 3/1969 | Busler | 206/717 |
| 5,769,236 A | * | 6/1998 | Maruyama et al. | 206/714 |
| 5,992,639 A | * | 11/1999 | Naito et al. | 206/714 |
| 6,270,614 B1 | * | 8/2001 | Naito et al. | 206/714 |
| 6,364,567 B1 | | 4/2002 | Asai et al. | |
| 6,404,181 B1 | * | 6/2002 | Hikita | 206/713 |

FOREIGN PATENT DOCUMENTS

| | | |
|---|---|---|
| DE | 33 11 634 A1 | 10/1984 |
| JP | 62-260672 | 11/1987 |
| JP | 62-260672 A | 11/1987 |
| JP | 2-43266 | 3/1990 |
| JP | 2-043266 U | 3/1990 |
| JP | 04-018262 | 1/1992 |

(Continued)

OTHER PUBLICATIONS

Japanese Office Action Dated Jul. 9, 2007.
Japanese Office action with English translation dated Apr. 9, 2008.

(Continued)

*Primary Examiner*—Bryon P Gehman
(74) *Attorney, Agent, or Firm*—Pearne & Gordon LLP (57) ABSTRACT

In a carrier tape for supplying an electronic part to an electronic part mounting apparatus for taking out the electronic part from a tape feeder to mount to a board, a tail side connecting portion having a cutout portion is provided to a tail side of the carrier tape mounted to the tape feeder, a front side connecting portion having a chipped portion is provided to a head side of the carrier tape to be used newly, respectively, and in tape splicing operation when a reel is interchanged, the cutout portion is fitted to the chipped portion and adhesive tapes are pasted thereon from two upper and lower faces thereof. Thereby, the tail side connecting portion and the head side connecting portion can be positioned in a longitudinal direction, a width direction and a thickness direction of the tape and held to each other and can efficiently be connected without using an exclusive connecting jig.

2 Claims, 11 Drawing Sheets

FOREIGN PATENT DOCUMENTS

| | | |
|---|---|---|
| JP | 04-031213 | 2/1992 |
| JP | 06-191554 | 7/1994 |
| JP | 7-165260 | 6/1995 |
| JP | 10-101178 | 4/1998 |
| JP | 11-091859 | 4/1999 |
| JP | 2000-289708 | 10/2000 |

OTHER PUBLICATIONS

Patent Abstracts of Japan, Hamano Yoshio, "IC Chip Carrier Tape and Production Thereof", Publication No. 07165260, Publication Date: Jun. 27, 1995, 1 page.

Chooi Kon Hing, "Method of Joining Two Component Tape Reels", XP-001096648, May 2000, pp. 34-35.

* cited by examiner

ELECTRONIC PART SUPPLYING TAPE AND ELECTRONIC PART SUPPLYING TAPE CONNECTING METHOD

BACKGROUND OF THE INVENTION

The present invention relates to an electronic part supplying tape for holding electronic parts on a tape-like member at a constant pitch and supplying the electronic parts and a method of connecting an electronic part supplying tape.

In an electronic part mounting apparatus, according to a method of supplying an electronic part to a transfer head, there is provided an electronic part supplying tape (hereinafter, simply abbreviated as "carrier tape") holding a number of electronic parts on a tape-like member. In the method, the carrier tape is supplied in a state of being wound around a supply reel, the carrier tape is extracted from the supply reel mounted on a tape feeder and fed pitch by pitch in synchronism with timings of mounting the electronic parts to thereby successively supply the electronic parts to a pickup position of the transfer head. Further, when shortage of part is brought about in the tape feeder in the mounting operation, a reel replacing operation for replacing the supply reel to a new one is carried out.

In a conventional art, when the reel is replaced, the operation is carried out in a state of removing a whole of a tape feeder main body from the mounting apparatus after stopping the mounting apparatus. However, in recent years, a method of connecting the carrier tape per se has been adopted, when the reel is replaced, in order to save wasteful time and man-hour caused by attaching and detaching the tape feeder by stopping the mounting apparatus at each time of bringing about shortage of part.

In the tape connecting operation, end portions of two new and old carrier tapes are aligned, and thereafter connected to each other by an adhesive tape or the like. In general, an exclusive connecting jig for carrying out the connecting operation is frequently used (for example, disclosed in JP-A-2000-289708 <Japanese Patent Application Publication Number: 2000-289708>). Further, in some cases, the connecting jig is not needed for connecting the end portions of the two carrier tapes (for example, disclosed in JP-A-10-101178 <Japanese Patent Application Publication Number: Hei10-101178>).

However, according to the above connecting jig (disclosed on JP-A-2000-289708), an operation of accurately matching alignment of the two carrier tapes and pitches of feed holes based on an outer shape or the feed hole of the carrier tape should be carried out, and the exclusive connecting jig is needed for each kind of the tape. Therefore, time and labor are required for carrying out the connecting operation. Particularly, when a number of kinds of tapes are mixedly used, complexity of using the connecting jigs according to the kinds for the respective tapes is unavoidable. Further, with regard to operational accuracy, depending on skill of an operator, proper jointing with accurate matching of the pitch or the alignment is not carried out, and there is a case of bringing about machine trouble in which tape feeding of the carrier tape after connection is not normally carried out.

Further, according to a method of connecting carrier tapes by fitting embossed portion for containing parts to each other as shown in JP-A-10-101178, the tapes can be jointed only in a case in which the embossed portion is of a specific shape, and this method is not applicable to a normal case in which a number of kinds of carrier tapes are used. In this way, according to the carrier tapes of the conventional arts, there poses a problem that it is difficult to efficiently carry out tape connecting operation, when the reels are replaced in accordance with shortage of part.

SUMMARY OF THE INVENTION

Therefore, it is an object of the present invention to provide an electronic part supplying tape and a method of connecting an electronic part supplying tape capable of efficiently carrying out tape connecting operation when reels are replaced.

According to a first aspect of the present invention, an electronic part supplying tape, used in a tape feeder arranged in a part supplying portion of an electronic part mounting apparatus, for holding electronic parts on a tape-like member at a constant pitch and for supplying the electronic parts, comprises a recessed portion for containing the electronic part therein, formed at a constant pitch on the tape-like member; a feed hole for feeding the tape-like member pitch by pitch, formed at a constant pitch on the tape-like member; a first connecting portion formed on an end portion on one side of the tape-like member; a second connecting portion formed on an end portion on the other side of the tape-like member, to be connected to the first connecting portion; an alignment means for positioning the first connecting portion and the second connecting portion in a longitudinal direction, a width direction and a thickness direction of the tape-like member, and a holding means for holding the first connecting portion and the second connecting portion to each other, wherein one of the electronic part supplying tapes and the other of the electronic part supplying tapes are connectable by connecting the first connecting portion of the one electronic part supplying tape and the second connecting portion of the other electronic part supplying tape.

Further, according to a second aspect of the present invention, in the electronic part supplying tape, the first connecting portion and the second connecting portion are formed by shaping the end portion on one side and the end portion on the other side of the tape-like member into fitting shapes fitted to each other, and the fitting shapes constitute the alignment means.

Further, according to a third aspect of the present invention, in the electronic part supplying tape, the first connecting portion and the second connecting portion are formed by coupling a locking member and a locked member respectively at the end portions of the tape-like member, and the locking member and the locked member constitute the alignment means.

Further, according to a fourth aspect of the present invention, in the electronic part supplying tape, the first connecting portion is formed by coupling a locking member at the end portion on one side of the tape-like member, and the second connecting portion is a connecting-shape-formed portion to be connected to the locking member, formed on the end portion on the other side of the tape-like member, and the locking member and the connecting-shape-formed portion constitutes alignment means.

Further, according to a fifth aspect of the present invention, the electronic part supplying tape is supplied by being wound around a supply reel in a state of containing the electronic part in the recessed portion.

Moreover, according to the present invention, an electronic part supplying tape connecting method, for connecting an electronic part supplying tape used in a tape feeder arranged in a part supplying portion of an electronic part mounting apparatus for holding electronic parts on a tape-like member at a constant pitch and for supplying the electronic parts, comprises steps of: aligning a first connecting portion provided at an end portion on one side of the one of the electronic part supplying tapes and a second connecting portion provided at the end portion on other side of the other of the electronic part supplying tapes in a longitudinal direction, a width direction and a thickness direction of the tape-like member; holding the first connecting portion and second connecting portion to each other, and connecting the first connecting portion and second connecting portion to each other.

According to the invention, the electronic supplying tapes are efficiently connected, without using a connecting jig, by connecting the first connecting portion provided at the end portion on one side of one of the electronic part supplying tapes and the second connecting portion provided at the end portion on the other side of other of the electronic part supplying tapes, to thereby aligning the first connecting portion and the second connecting portion in a longitudinal direction, a width direction and a thickness direction of the tape-like member, and hold the first connecting portion and the second connecting portion to each other.

DESCRIPTION OF THE PREFERRED EMBODIMENT

Figure 1:
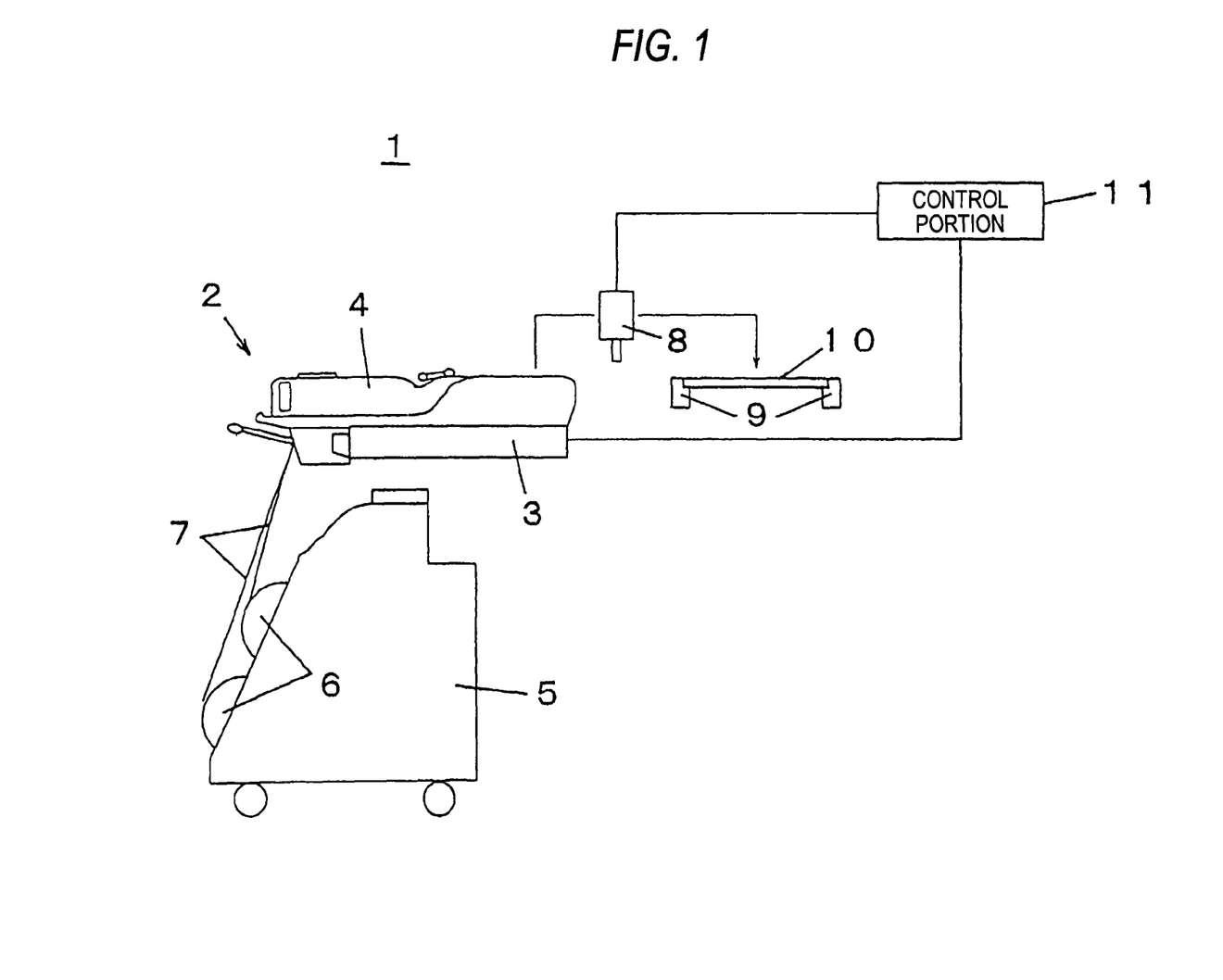
FIG. 1 is a sectional view of an electronic part mounting apparatus using an electronic part supplying tape according to an embodiment of the invention.
Figure 2:
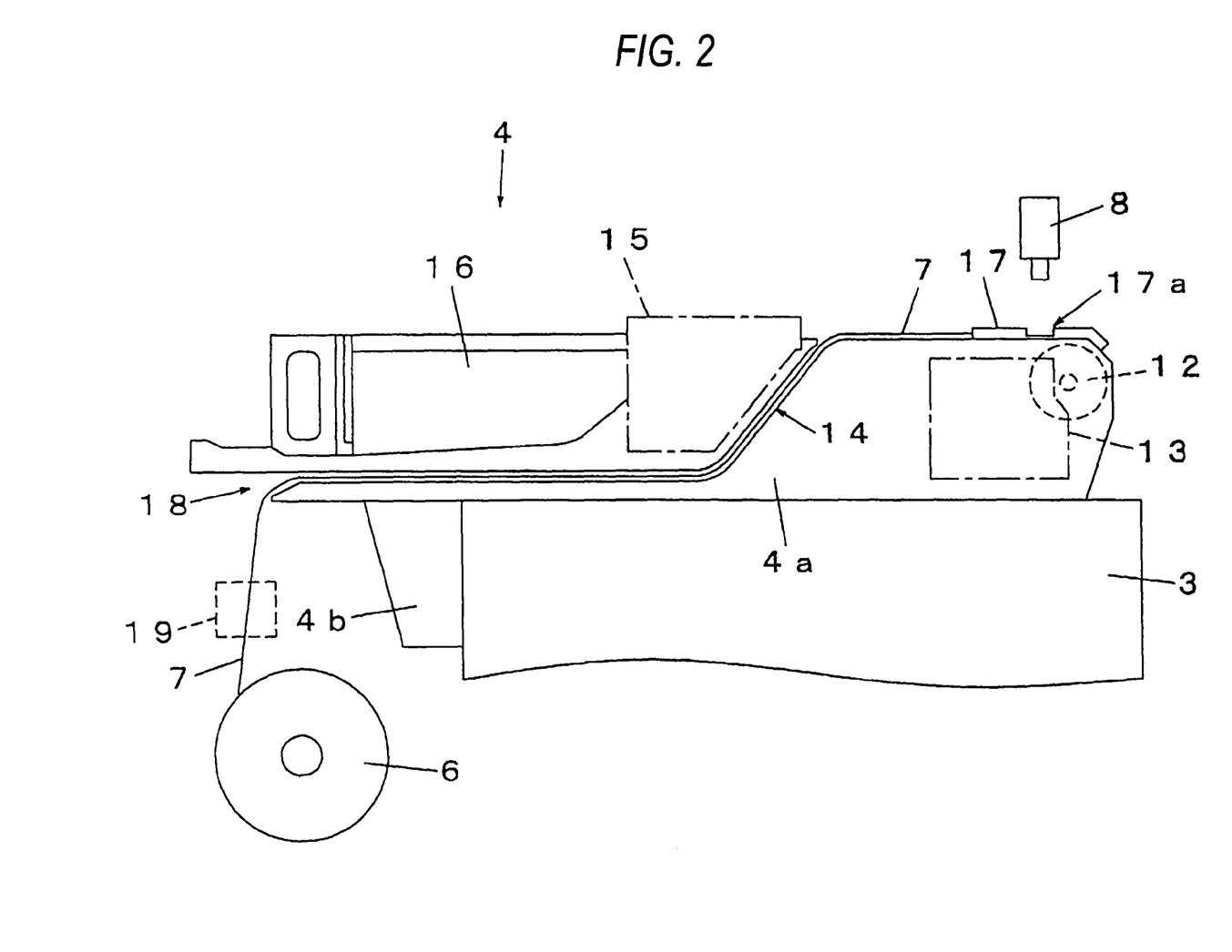
FIG. 2 is a side view of a tape feeder for feeding to supply the electronic part supplying tape according to the embodiment of the invention.
Figure 3:
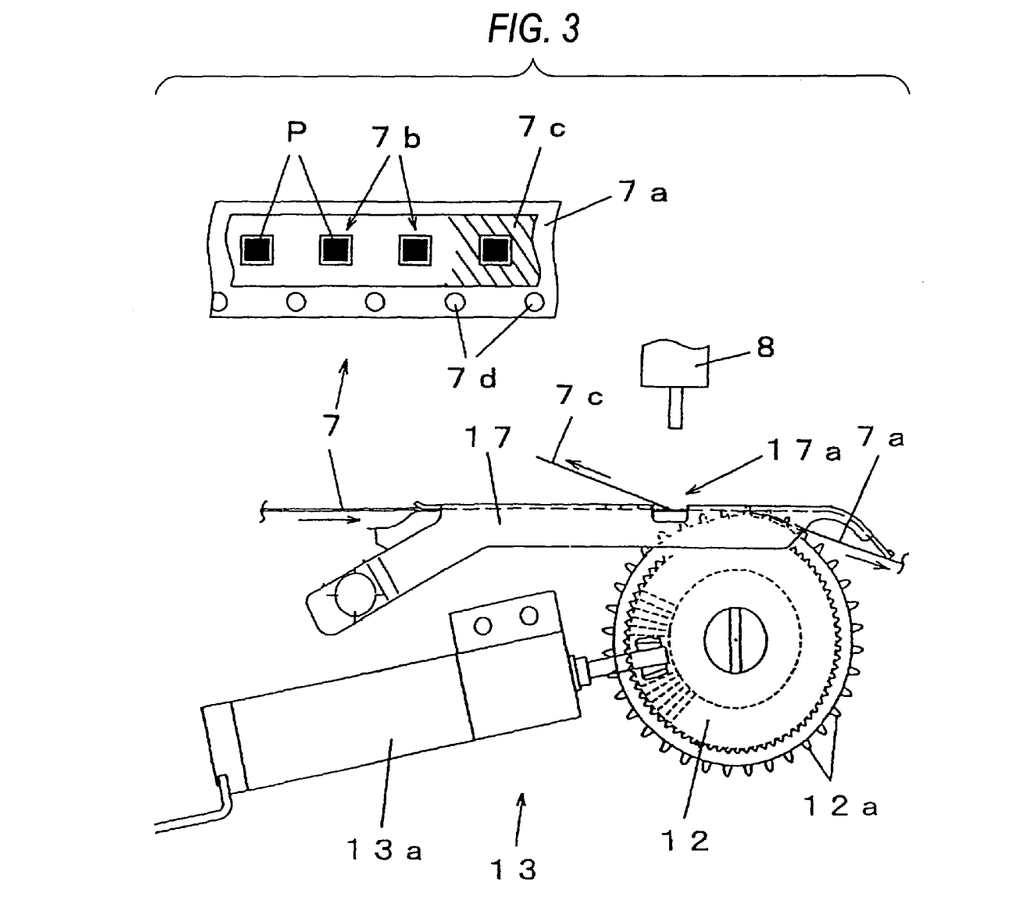
FIG. 3 is a side view of a pickup position of the tape feeder for feeding to supply the electronic part supplying tape according to the embodiment of the invention.

An explanation of embodiments of the present invention will be given in reference to the drawings as follows. FIG. 1 is a sectional view of an electronic part mounting apparatus using an electronic part supplying tape according to an embodiment of the invention, FIG. 2 is a side view of a tape feeder for feeding to supply the electronic part supplying tape according to the embodiment of the invention, FIG. 3 is a side view of a pickup position of the tape feeder for feeding to supply the electronic part supplying tape according to the embodiment of the invention, FIG. 4A to and FIG. 7B illustrate explanatory views of a method of connecting the electronic part supplying tape according to the embodiment of the invention, FIG. 8A, FIG. 8B, FIG. 10A, FIG. 10B, FIG. 10C FIG. 11A and FIG. 11B illustrates perspective views of attachments used for connecting the electronic part supplying tape according to the embodiment of the invention and FIG. 9 illustrates explanatory views of a method of fixing the attachments used for connecting the electronic part supplying tape according to the embodiment of the invention.

First, a structure of the electronic part mounting apparatus will be explained in reference to FIG. 1. In FIG. 1, the electronic part mounting apparatus 1 is provided with a part supplying portion 2 for supplying an electronic part and the part supplying portion 2 is provided with a feeder base 3 for mounting a tape feeder 4. A carriage 5 for supplying parts is transferred to a lower face side of the feeder base 3 and the carriage 5 is set with a plurality of supply reels 6. The supply reel 6 supplies a carrier tape 7 which is an electronic part supplying tape in a wound state.

An upper face of the feeder base 3 is arranged with a plurality of the tape feeders 4, the tape feeder 4 extracts the carrier tape 7 from the supply reel 6 to feed to a pickup position by a transfer head 8 pitch by pitch. The transfer head 8 is controlled by a control portion 11 to transfer the electronic part picked up from the tape feeder 4 to a board 10 positioned on a transfer path 9.

Next, the structure of the tape feeder 4 and the constitution of the carrier tape 7 will be explained in reference to FIG. 2 and FIG. 3. As shown by FIG. 2, the tape feeder 4 is mounted in the form in which a lower face of a main body portion 4a is made to be along an upper face of the feeder base 3 and the tape feeder 4 is fixed by locking a locking portion 4b projected from the main body portion 4a to a lower side by an end portion of the feeder base 3. The locking portion 4a includes a connector for connecting electric wirings of a power source, control signals and the like of the tape feeder 4 to an electric circuit of the electronic part mounting apparatus 1 and electric connection is finished by mounting the tape feeder 4 to the feeder base 3.

The constitution of the carrier tape 7 will be explained here. There is constructed a constitution in which an electronic part P is held in a recessed portion 7b provided in a base tape 7a which is a tape-like member at a constant pitch and an upper side of the recessed portion 7b is covered by a top tape 7c. A feed hole 7d used for feeding the tape is provided at a side end portion on one side of the base tape 7a at a constant pitch along a length direction.

In FIG. 3, a front end portion (right side in FIG. 3) of the tape feeder 4 is arranged with a sprocket 12. A feed pin 12a of the sprocket 12 is brought in mesh with the feed hole 7d provided at the base tape 7a to feed the carrier tape 7 pitch by pitch by rotating the sprocket 12 pitch by pitch by a motor 13a of a tape feeding mechanism 13. By feeding the tape, the carrier tape 7 is extracted from the supply reel 6.

As shown by FIG. 2, the extracted carrier tape 7 is introduced from a tape introducing portion 18 provided at a rear end portion of the tape feeder 4 into the main body portion 4a and fed in a front direction along a tape supply path 14. An interval between the supply reel 6 and the tape introducing portion 18 constitutes a tape splicing position 19 for butting together a tail portion of the mounted carrier tape introduced to the main body portion 4a and a head portion of a carrier tape to be mounted newly.

By carrying out the tape splicing operation for connecting the tapes in this way, in continuous operation for extracting the carrier tape 7 from the plurality of supply reels 6 and supplying the electronic part, mounting operation can be carried out without stopping the mounting apparatus at each time of interchanging the reels. As described later, according to the embodiment, each of various kinds of the carrier tapes as shown by FIG. 4A through FIG. 7B is previously provided with connecting end portions for connection respectively at the tail portion and the head portion such that the tape splicing operation can be carried out without using an exclusive connecting jig.

The front end portion of the tape feeder 4 constitutes the pickup position of the electronic part by the transfer head 8 and as shown by FIG. 3, the fed carrier tape 7 is fed pitch by pitch on a lower side of a holding member 17 provided at an upper face of a front end portion thereof. At a midst of feeding the tape pitch by pitch, the electronic part P held at inside of the recessed portion 7b of the base tape 7a is picked by the transfer head 8 via an opening portion 17a provided at the holding member 17. Prior to picking up the electronic part P, the top tape 7c is exfoliated from the upper face of the base pate 7a, folded back to a rear side and contained into a tape containing vessel 16 by a top tape feed mechanism 15.

Figure 4A:
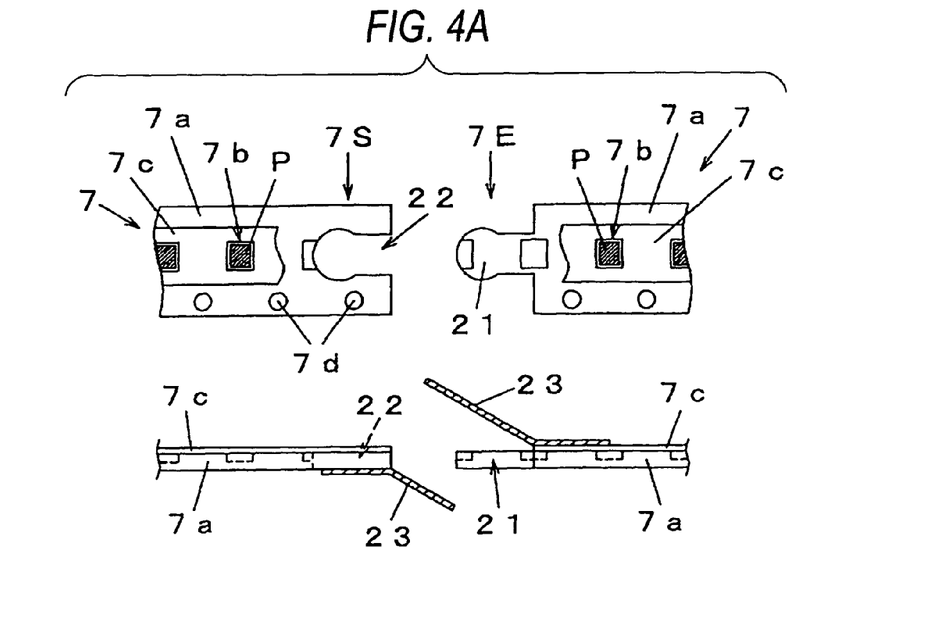
FIG. 4A and FIG. 4B illustrate explanatory views of a method of connecting the electronic part supplying tape according to the embodiment of the invention.
Figure 4B:
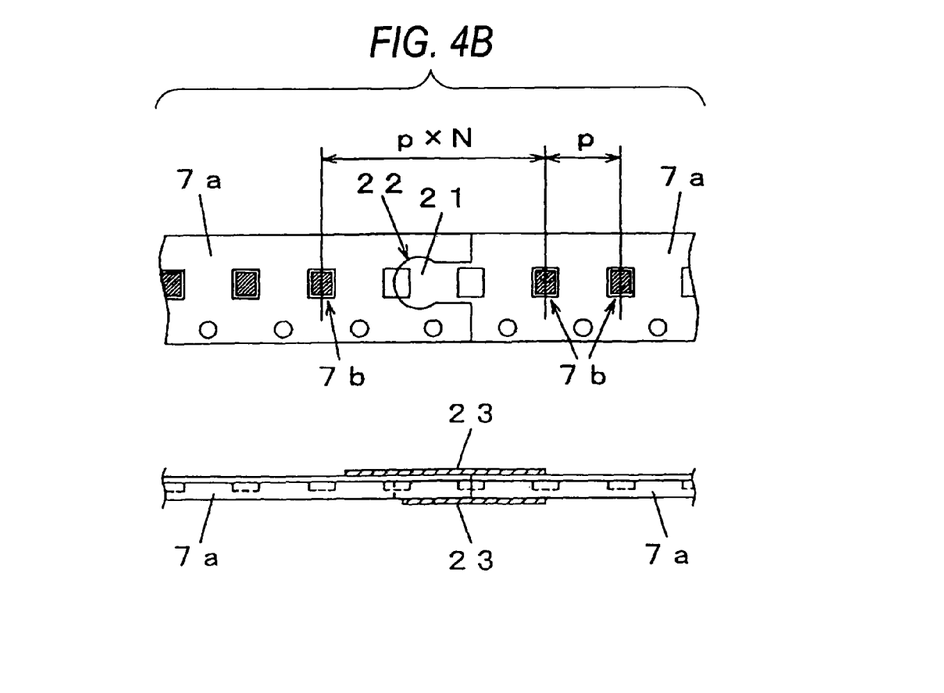

An explanation will be given of a method of connecting the electronic part supplying tape which is carried out at the tape splicing position 19 by constituting an object by a plurality of kinds of carrier tapes used in the embodiment as follows. FIG. 4A and FIG. 4B illustrate a connecting method by constituting the object by the carrier tape 7 of a type forming the recessed portion 7b at the base pate 7a made of paper by pressing. FIG. 4A shows a state of butting together a tail connecting end portion 7E (first connecting portion) provided at an end portion on a tail side of the carrier tape 7 (one electronic part supplying tape) mounted to the tape feeder 4 and a front connecting end portion 7S (second connecting portion) provided at an end portion on a front side of the carrier tape 7 (other electronic part supplying tape) to be mounted newly at an interval therebetween.

The tail connecting end portion 7E is constituted by a shape of punching the base tape 7a by leaving a cutout portion 21 in a shape of a circular spoon and the front end connecting end portion 7S is constituted by a shape of providing a chipped portion 22 by being punched in a shape of fitting the cutout portion 21. Further, an upper face of the tail connecting end portion 7E and a lower face of the head connecting end portion 7S are respectively pasted with adhesive tapes 23 to extend in directions of sides of counterparts of connection.

FIG. 4B shows a state of connecting the tail connecting end portion 7E and the head connecting end portion 7S by fitting the cutout portion 21 to the chipped portion 22. Here, a positional relationship between the cutout portion 21 and the chipped portion 22 in a longitudinal direction of the tape is determined such that an interval between the recessed portion 7b disposed on a rearmost end side of the mounted carrier tape 7 and a recessed portion 7b disposed on a frontmost end side of the carrier tape 7 to be mounted newly becomes a unit pitch p of the recessed portion 7b multiplied by N (integer).

Thereby, when two of the carrier tapes 7 are connected, an aligning pitch of the electronic part P is maintained at a prescribed pitch. Further, although there are brought about the recessed portions 7b in which the electronic parts P are not present frontward and rearward of the connecting position, by automatically detecting absence of part in the pickup operation by the transfer head 8, pitch feeding is automatically carried out and malfunction is not brought about thereby.

Further, a positional relationship between the cutout portion 21 and the chipped portion 22 in the tape width direction is set such that both side end faces coincide with each other when two of the carrier tapes P are connected. Further, in a state of fitting the cutout portion 21 to the chipped portion 22 to connect to each other, the adhesive tapes 23 previously pasted on the respective sides are pasted on an upper face and a lower face of the base tapes 7a on connection counterpart sides.

Further, in a plane view of FIG. 4B, illustration of the top tape 7c and the adhesive tape 23 is omitted. When the adhesive tape 23 is pasted, the adhesive tape 23 may be pasted on the top tape 7c or the top tape 7c may be exfoliated. The operation is similar also in examples shown in FIG. 5A through FIG. 7B.

Thereby, in a state of connecting two of the carrier tape 7, positioning in the thickness direction of the base tape 7a is correctly carried out and the tail connecting end portion 7E and the head connecting end portion 7S are held to each other by sufficient holding force by locking force by fitting the cutout portion 21 to the chipped portion 22 and adhering force of the adhesive tape 23. Tape tension is transmitted to the new carrier tape 7 and the tape is extracted normally from the supply reel 6.

That is, in the above-described constitution, the tail connecting end portion 7E (first connecting portion) and the head connecting end portion 7S (second connecting portion) are formed by being shaped in fitting shapes for fitting the end portion on one side and the end portion on the other side of the base tapes 7a constituting the tape-like members to each other. Further, the cutout portion 21, the chipped portion 22 and the adhesive tape 23 constitute alignment means for positioning the tail connecting end portion 7E and the head connecting end portion 7S in the longitudinal direction, the width direction and the thickness direction of the base tape 7a and constitute holding means for holding the tail connecting end portion 7E and the head connecting end portion 7S to each other.

Further, although an example of providing the cutout portion 21 at the tail connecting end portion 7E and providing the chipped portion 22 at the head connecting end portion 7S is shown here, contrary to the example shown in FIG. 4A and FIG. 4B, the cutout portion 21 and the chipped portion 22 may be provided to switch.

Further, by such a constitution, in shortage of part of one of the supply reels 6, when the head portion of the carrier tape 7 of the supply reel 6 to be mounted newly is connected to the tail portion of the mounted carrier tape 7, the head portion and the tail portion can be connected by simple operation of fitting the cutout portion 21 to the chipped portion 22 and two of the carrier tapes 7 can be connected without using an exclusive connecting jig. Further, the method shown in FIG. 4A and FIG. 4B is not limited to the tape made of paper but is applicable so far as the base tape is a carrier tape of a kind having a substantial thickness capable of shaping fitted shapes.

Figure 5A:
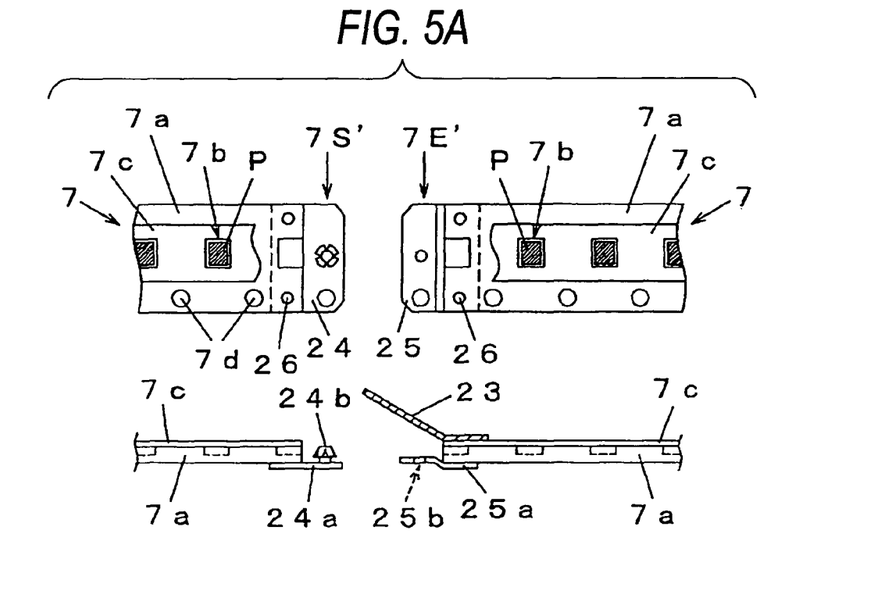
FIG. 5A and FIG. 5B illustrate explanatory views of a method of connecting the electronic part supplying tape according to the embodiment of the invention.

Next, an explanation of other embodiment of a connecting method when a carrier tape of a type similar to that of FIG. 4A and FIG. 4B constitutes an object will be given in reference to FIG. 5A and FIG. 5B. Here, a method of using an attachment for connection will be shown in place of the method of shaping the end portion of the base tape 7a. FIG. 5A shows a state in which a tail connecting end portion 7E' (first connecting portion) provided at an end portion of a tail side of the carrier tape 7 (one electronic part supplying tape) mounted to the tape feeder 4 and a head connecting end portion 7S' (second connecting portion) provided at an end portion on a head side of the carrier tape 7 (other electronic part supplying tape) to be mounted newly are butted to each other at an interval therebetween.

The tail connecting end portion 7E' and the head connecting end portion 7S' are respectively fixed with attachments 25 and 24 by pins 26 for fixedly coupling. The attachments 25 and 24 are paired tape connecting members, one of the members constitutes a locking member and other thereof constitutes a locked member. Further, the adhesive tape 23 is pasted on an upper face of the tail connecting end portion 7E' to extend in a direction of a connection counterpart side.

Figure 8A:
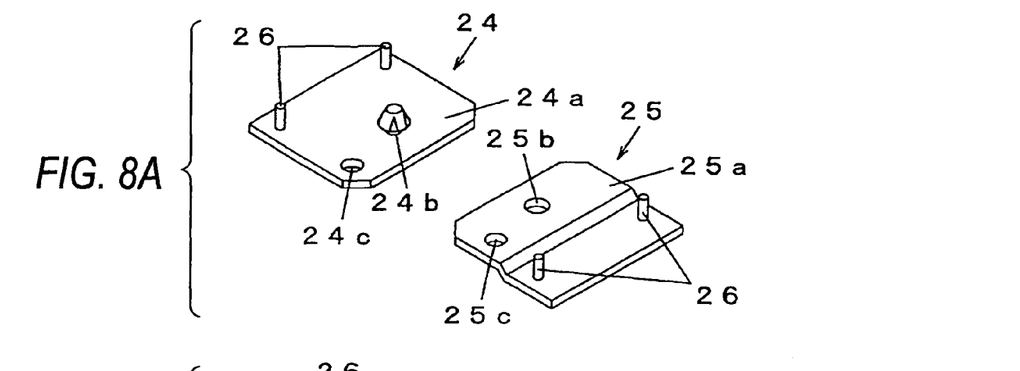
FIG. 8A, FIG. 8B and FIG. 8C illustrate perspective views of an attachment used for connecting the electronic part supplying tape according to the embodiment of the invention.

Structures of the attachments 25 and 24 will be explained in reference to FIG. 8A. Both of the attachments 25 and 24 are fabricated by molding a resin and respectively provided with plate-like portions 25a and 24a in correspondence with a width dimension of the base tape 7a and the pins 26 are erected respectively from the plate-like portions 25a and 24a. A pin 24b for one touch fixing is erected from an upper face of the plate-like portion 24a and the plate-like portion 25a is provided with an engaging hole 25b for engaging the pin 24b.

Further, the plate-like portions 25a and 24a are respectively provided with feed holes 24c and 25c by selecting a position at which the plate-like portions 24a and 25a overlap in a state of engaging the pin 24b to the engaging hole 24b and a position at which a positional relationship between the feeding hole and a contiguous feeding hole constitute a position in correspondence with a regular hole pitch. Further, the plate-like portion 25a is constituted by a stepped shape such that a stepped difference between the plate-like portions 24a and 25a in an up and down direction is not produced at the position of the pin 26 in a state of bringing the plate-like portions 24a and 25a into close contact with each other by engaging the pin 24b to the engaging hole 25b.

An explanation of a method of connecting the attachments 25 and 24 to the base tape 7a by the pin 26 will be given here. Although FIG. 9A shows an example of coupling the pin 26 erected from the plate-like portion 24a of the attachment 24 to the base tape 7a, a similar method is used also when various attachments according to the embodiment are coupled to various base tapes.

Figure 9A:
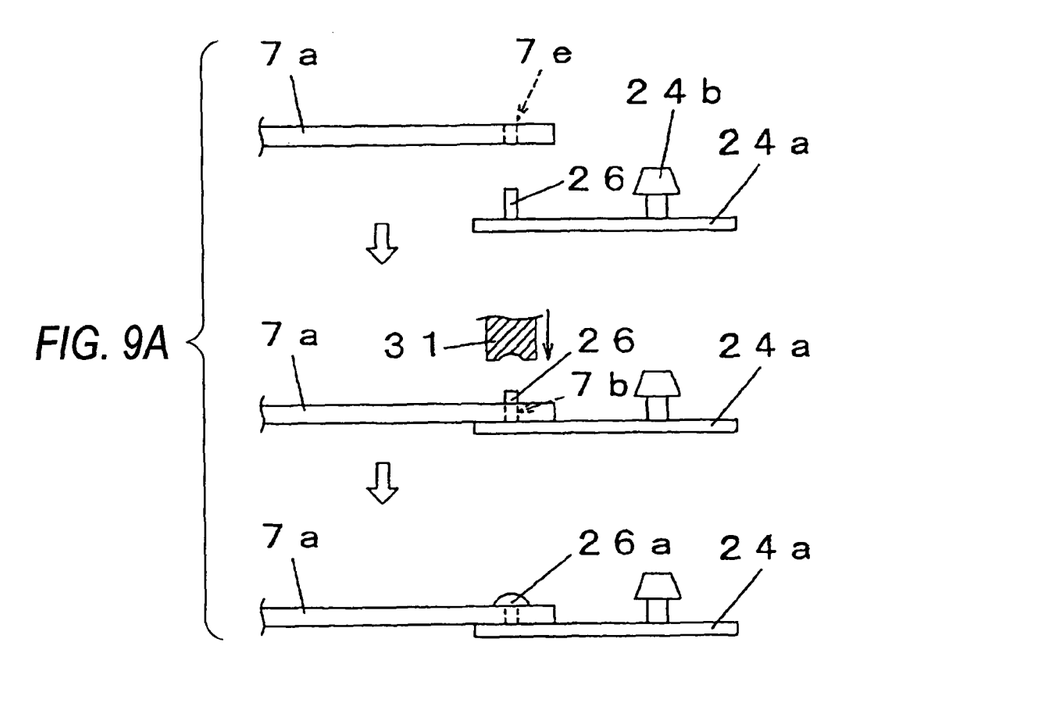
FIG. 9A and FIG. 9B illustrate explanatory views of a method of fixing the attachment used for connecting the electronic part supplying tape according to the embodiment of the invention.

As shown in FIG. 9A, the base pate 7a is attached with a pin hole 7e for coupling attachment and when the attachment is coupled, first, the pin 26 is fitted to the pin hole 7e to match positions in the width direction and the length direction and the plate-like portion 24a is brought into close contact with a lower face of the base tape 7a.

Next, a calking tool 31 is positioned to the pin 26 and moved down to the base tape 7a to crush to calk the pin 26 from an upper side. Thereby, an upper end portion of the pin 26 is pushed to spread at an upper face of the base pate 7a and the plate-like portion 24a is coupled to the base tape 7a by the pin 26. The upper end portion of the pin 26 may be thermally deformed to push to spread by using the calking tool 31 having a heating apparatus.

Figure 9B:
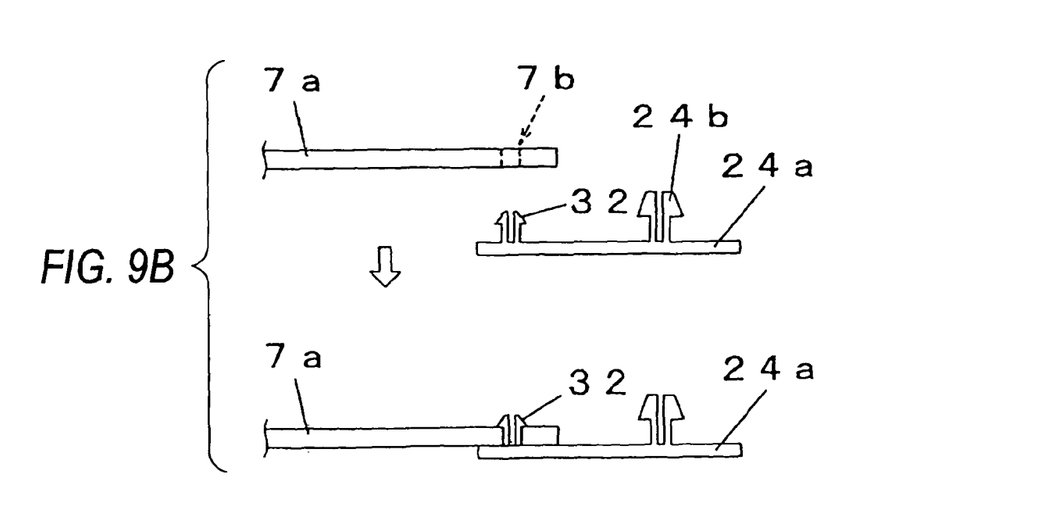

Further, instead of coupling the pin 26 in a simple pillar shape to the base tape 7a, as shown by FIG. 9B, there may be used a pin 32 of one touch lock type which is slotted in an axial direction. According to the method, the attachment can simply be coupled to the base tape 7a without carrying out calking operation. Further, a pin having a similar structure may be used for the pin 24b.

Figure 5B:
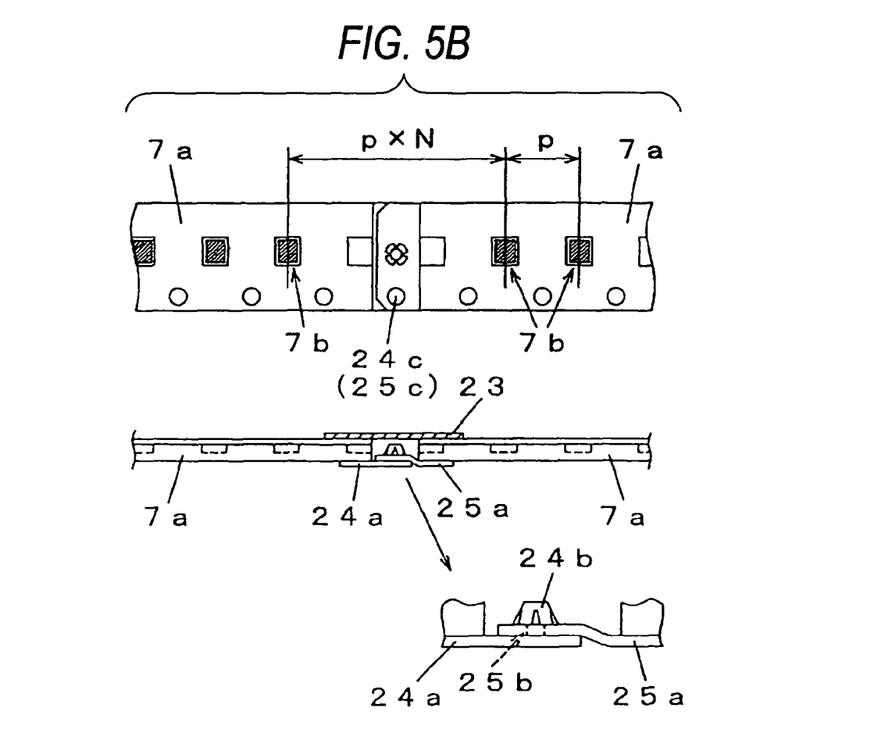

FIG. 5B shows a state of connecting the tail connecting end portion 7E' and the head connecting end portion 7S'. The connection is carried out by positioning the attachments 24 and 25 to each other and inserting the pin 24b to the engaging hole 25b to engage and thereafter pasting the previously pasted adhesive tape 23 onto the upper face of the base tape 7a on the connection counterpart side. Although under the state, the upper face of the plate-like portion 24a and the lower face of the plate-like portion 25a are brought into close contact to overlap, as described above, since the plate-like portion 25a is constituted by the stepped shape, the lower faces of the base tapes 7a butted to each other are aligned on the same plane.

Further, the positional relationship between the pin 24b and the engaging hole 25b in the longitudinal direction of the attachments 24 and 25 is determined such that the interval between the recessed portion 7b disposed on the rearmost end side of the mounted carrier tape 7 and the recessed portion 7b disposed on the frontmost end side of the carrier tape 7 to be mounted newly becomes the unit pitch p of the recessed portion 7b multiplied by N (integer), thereby, the aligning pitch of the electronic part P is maintained at the prescribed pitch when two of the carrier tapes 7 are connected. Further, when two of the carrier tape 7 are connected, positions of the pin 24b and the engaging hole 25b are set such that two side end faces coincide with each other.

Thereby, in the state of connecting two of the carrier tapes 7, positioning of the base tape 7a in the thickness direction is correctly carried out and the tail connecting end portion 7E' and the head connecting end portion 7S' are held by each other by sufficient holding force by locking force by engaging the pin 24b to the engaging hole 25b and adhering force of the adhesive tape 23. In the connected state, the feed holes 24c and 25c respectively provided at the plate-like portions 24a and 25a overlap each other to dispose at the same position and function as the feed hole in feeding the carrier tape 7 pitch by pitch. Further, also in the embodiment, there are brought about the embossed portions at which the electronic parts P are not present frontward and rearward from the connecting position, however, similar to the above-described case, by automatic detecting in pickup operation, the electronic parts are continued to supply without malfunction. The same goes with respective embodiments, mentioned later, shown in FIG. 6A, FIG. 6B, FIG. 7A and FIG. 7B.

That is, in the above-described constitution, the tail connecting end portion 7E' (first connecting portion) and the head connecting end portion 7S' (second connecting portion) are formed by coupling the attachments 24 and 25 which are a pair of the locking member and the locked member at respective end portions of the base tape 7a which is the tape-like member. Further, as described above, the attachments 24 and 25 set with the positional relationship between the pin 24b and the engaging hole 25b constitute alignment means for positioning the tail connecting end portion 7E' and head connecting end portion 7S' in the longitudinal direction, the width direction and the thickness direction of the base tape 7a and also constitute holding means for holding the tail connecting end portion 7E' and the head connecting end portion 7S' to each other.

Further, also according to the constitution, when the head portion of the carrier tape 7 of the supply reel 6 to be mounted newly is connected to the tail portion of the mounted carrier tape 7 in shortage of part of the one supply reel 6, the tail connecting end portion 7E' and the head connecting end portion 7S' can be connected simply by engaging the pin 24a and the engaging hole 24b of the attachments 24 and 25 and two of the carrier tape 7 can be connected without using an exclusive connecting jig. Further, although sufficient holding force can be exerted without using the adhesive tape 23, it is preferable to also use the adhesive tape 23 to stably connect the carrier tapes.

Figure 6A:
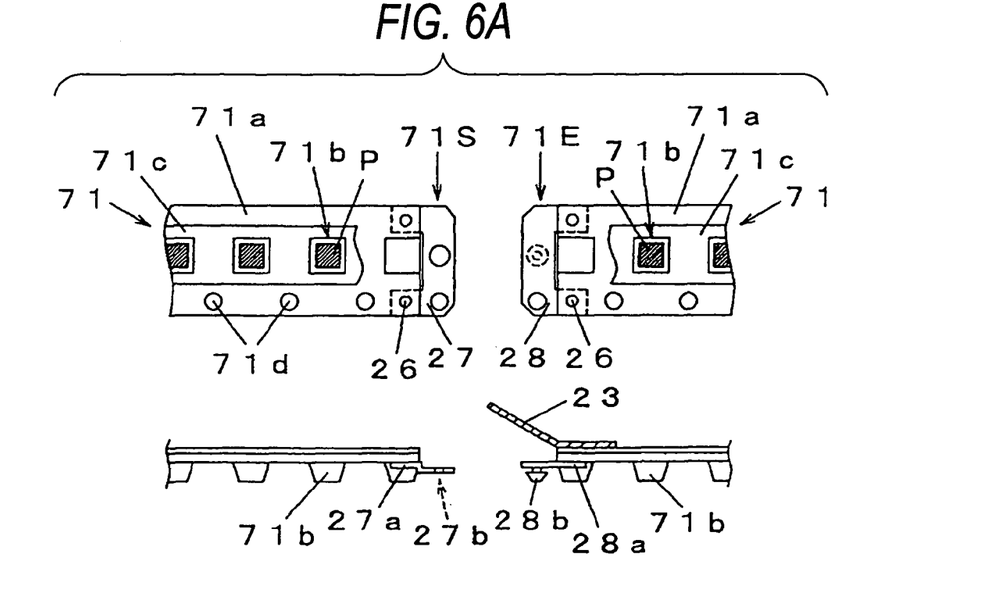
FIG. 6A and FIG. 6B illustrate explanatory views of a method of connecting the electronic part supplying tape according to the embodiment of the invention.
Figure 6B:
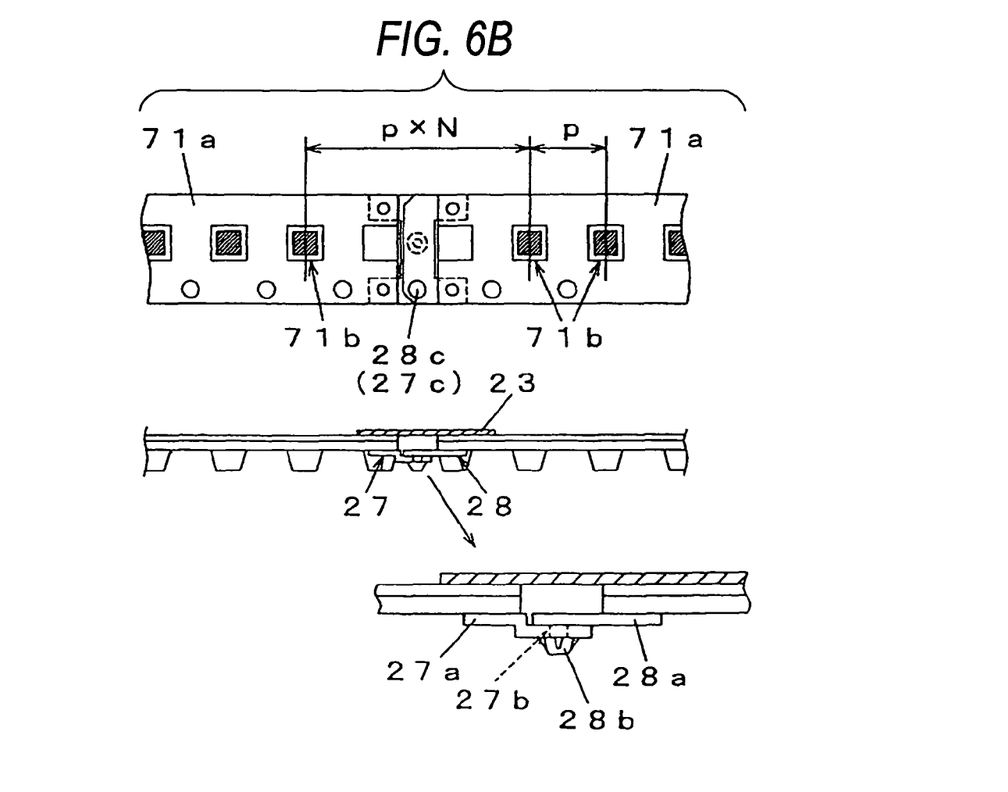

FIG. 6A and FIG. 6B show a connecting method constituting an object by a carrier tape 71 provided with an embossed portion 71b as a recessed portion for containing an electronic part at a base tape 71a made of a resin as a carrier tape and an attachment for connection is used here similar to FIG. 5A and FIG. 5B. FIG. 6A shows a state in which a tail connecting end portion 71E (first connecting portion) provided at an end portion on a tail side of the carrier tape 71 (one electronic part supplying tape) mounted to the tape feeder 4 and a head connecting end portion 71S (second connecting portion) provided at an end portion on a head side of the carrier tape 71 (other electronic part supplying tape) to be mounted newly are butted to each other at an interval therebetween.

The tail connecting end portion 71E and the head connecting end portion 71S are fixed with attachments 28 and 27 respectively by the pins 26 for fixedly connecting by the method shown in FIG. 9A and FIG. 9B. The attachments 28 and 27 are paired tape connecting members and function similar to the attachments 25 and 24 shown in FIG. 5A and FIG. 5B by using one of them as a locking member and using other thereof as a locked member. Further, the adhesive tape 23 is pasted onto an upper face of the tail connecting end portion 71E to extend in a direction of a connection counterpart side.

Figure 8B:
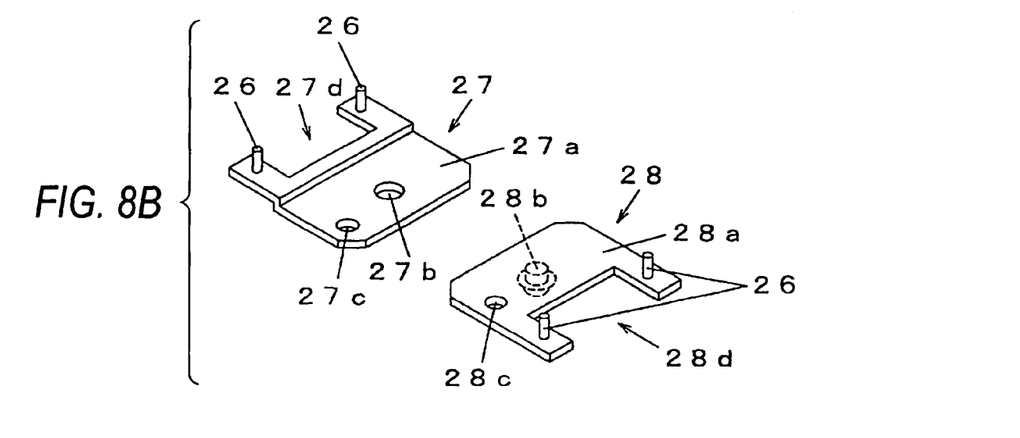

Structures of the attachments 28 and 27 will be explained in reference to FIG. 8B. Both of the attachments 28 and 27 are fabricated by molding a resin and provided with plate-like portions 28a and 27a having sizes respectively in correspondence with the width direction of the base tape 71a. The pins 26 are erected respectively from the plate-like portions 28a and 27a and notched portions 28d and 27d are provided on inner side of positions of arranging the pins 26 to prevent interference with the embossed portions 71b in coupling with the base tape 71a. A pin 28b for one touch fixing is erected downwardly from a lower face of the plate-like portion 28a and the plate-like portion 27a is provided with an engaging hole 27b for engaging with the pin 28b.

Further, the plate-like portions 28a and 27a are respectively provided with feed holes 28c and 27c by selecting a position at which the plate-like portions 28a and 27a overlap each other in a state of engaging the pin 27b to the engaging hole 26b and a position at which a positional relationship of the feed hole with a contiguous feed hole in the longitudinal direction constitutes the position in correspondence with a regular hole pitch. Further, the plate-like portion 27a is constituted by a stepped shape such that a stepped difference between the plate-like portions 27a and 28a in an up and down direction is not brought about at the position of the pin 26 in a state in which the pin 28b is engaged with the engaging hole 27b to bring the plate-like portions 27a and 28a into close contact with each other.

FIG. 6B shows a state of connecting the tail connecting end portion 71E and the head connecting end portion 71S. The connection is carried out by positioning the pin 28b to the engaging hole 27b, inserting the pin 28b into the engaging hole 27b to engage and pasting the previously pasted adhesive tape 23 onto the upper face of the base tape 71a on the connection counterpart side. In the state, the upper face of the plate-like portion 27a and the lower face of the plate-like portion 28a are brought into close contact with each other to overlap and as described above, since the plate-like portion 27a is constituted by the stepped shape, the lower faces of the base tapes 71a butted to each other are matched to the same plane.

Further, the positional relationship between the engaging holes 27b and the pin 28b of the attachments 27 and 28 in the longitudinal direction is determined such that an interval between the embossed portion 71b disposed at a rearmost end side of the mounted carrier tape 71 and the embossed portion 71b disposed on a frontmost end side of the carrier tape 71 to be mounted becomes the unit pitch p of the embossed portion 71b multiplied by N (integer), thereby, when two of the carrier tapes 71 are connected, the aligning pitch of the electronic part P is maintained at the prescribed pitch. Further, when two of the carrier tapes 71 are connected, positions of the pin 28b and the engaging hole 27b in the width direction are set such that both side end faces thereof coincide with each other.

Thereby, in a state of connecting two of the carrier tapes 71, positioning of the base tape 71a in the thickness direction is correctly carried out and the tail connecting end portion 71E and the head connecting end portion 71S are held to each other by sufficient holding force by locking force by engaging the pin 28b to the engaging hole 27b and the adhering force of the adhesive tape 23. In the connected state, the feed holes 27c and 28c respectively provided at the plate-like portions 27a and 28a overlap each other to dispose at the same position and function as the feed hole in feeding the carrier tape 71 pitch by pitch.

Figure 7A:
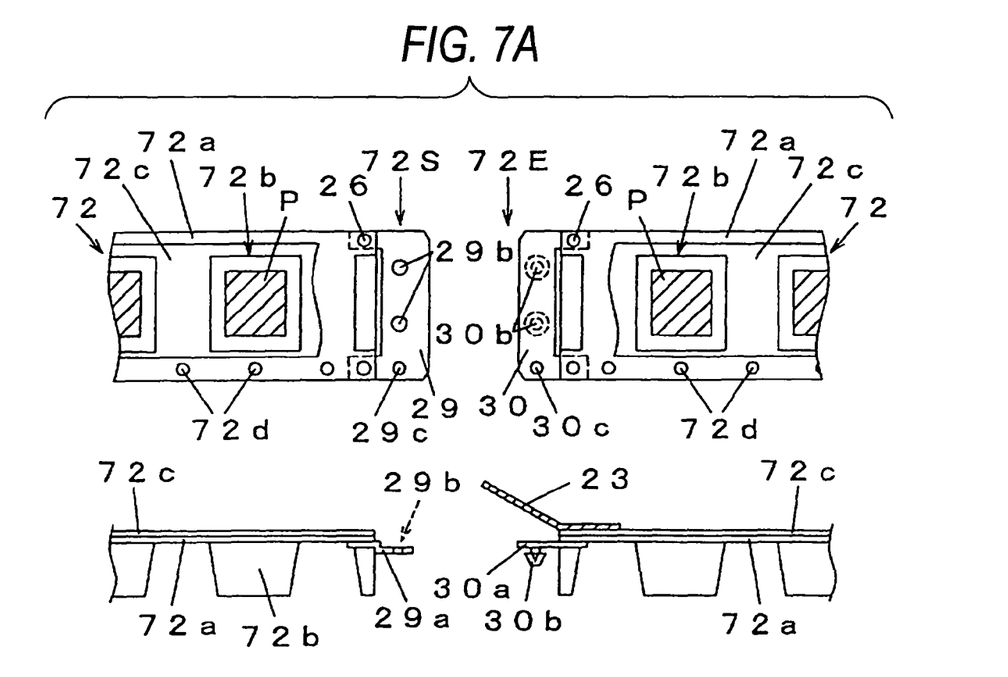
FIG. 7A and FIG. 7B illustrate explanatory views of a method of connecting the electronic part supplying tape according to the embodiment of the invention.
Figure 7B:
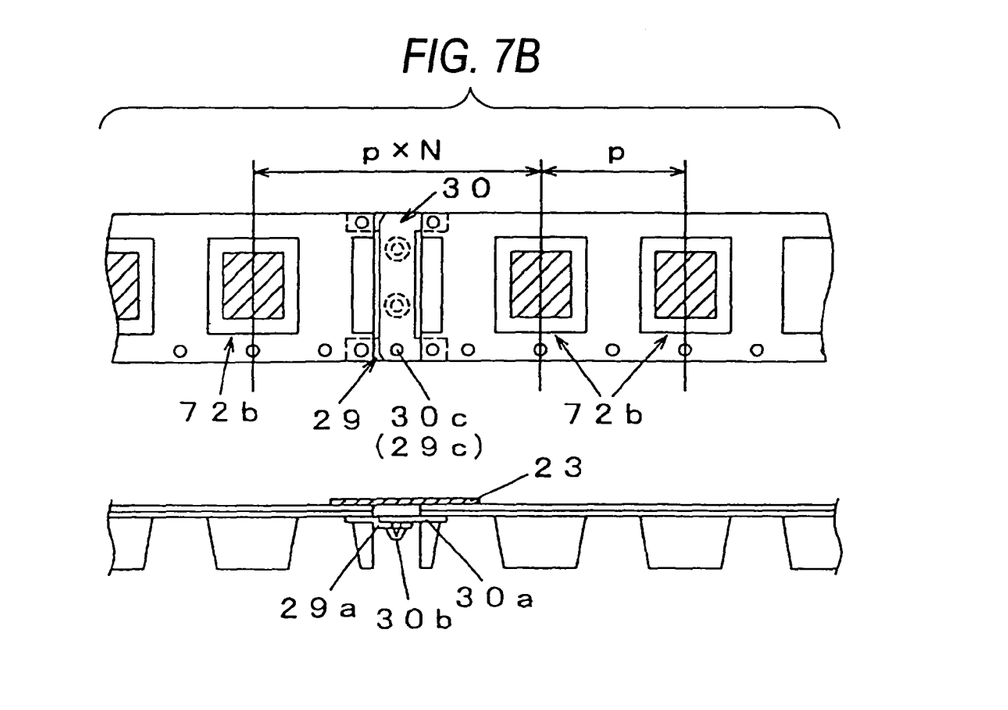

FIG. 7A and FIG. 7B show a method of connecting a carrier tape 72 having a wide width size provided with an embossed portion 72b as a recessed portion for containing an electronic part at a base tape 72a made of a resin similar to the carrier tape 71 by using a similar attachment. FIG. 7A shows a state in which a tail connecting end portion 72E (first connecting portion) provided at an end portion on a tail side of the carrier tape 72 (one electronic part supplying tape) mounted to the tape feeder 4 and a head connecting end portion 72S (second connecting portion) provided at an end portion of a head portion of the carrier tape 72 (other electronic part supplying tape) to be mounted newly are butted to each other at an interval therebetween.

The tail connecting end portion 72E and the head connecting end portion 72S are fixed with attachments 30 and 29 respectively by the pins 26 for fixedly connecting by the method shown in FIG. 9A and FIG. 9B. The attachments 30 and 29 are paired tape connecting members and function similar to the attachments 25 and 24 shown in FIG. 5A and FIG. 5B by using one of the members as a locking member and using other thereof as a locked member. Further, the adhesive tape 23 is pasted on an upper face of the tail connecting end portion 72E to extend in a direction of a connection counterpart side.

Figure 8C:
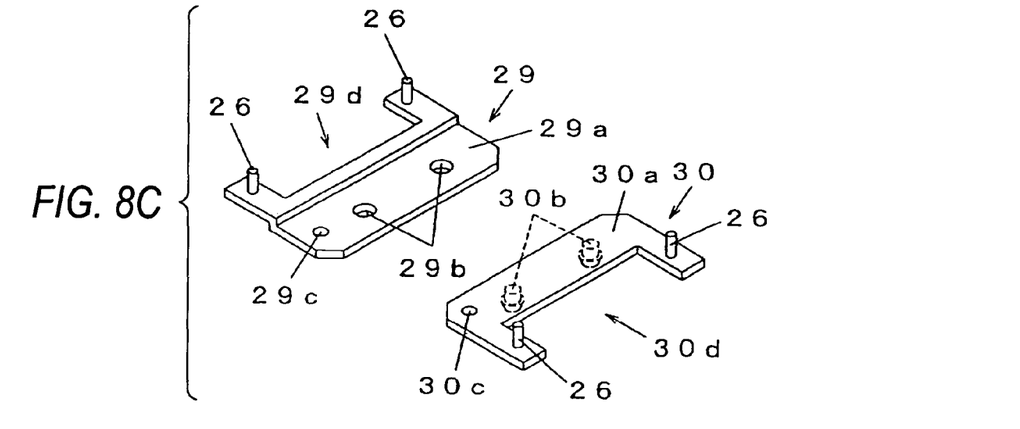

Structures of the attachments 30 and 29 will be explained in reference to FIG. 8C. The attachments 30 and 29 are provided with plate-like portions 30a and 29a in correspondence with the width dimension of the base pate 72a having the wide width and therefore, constructed by a constitution in which two of pins 30b and engaging holes 30b engaging with the pins 30 are arranged respectively in the width direction. The other constitution is similar to that of the attachments 28 and 27 and by substituting 30 and 29 for 28 and 27 in the explanation of FIG. 8B, respective elements excluding 29b and 30b of FIG. 8C will be explained.

FIG. 7B shows a state of connecting the tail connecting end portion 72E and the head connecting end portion 72S. The connection is carried out by a method similar to that of the example shown in FIG. 6A and FIG. 6B. At this occasion, feed holes 30c and 29c overlap each other to dispose at the same position and similarly function as the feed hole in feeding the carrier tape 72 pitch by pitch.

Further, when two of the carrier tapes 72 are connected such that an interval between the embossed portion 72b disposed on a rearmost end side of the mounted carrier tape 72 and the embossed portion 72b disposed on a frontmost end side of the carrier tape 72 to be mounted newly becomes the unit pitch p of the embossed portion 72b multiplied by N (integer), shapes, dimensions and positional relationships of respective portions of the attachments 30 and 29 are determined such that two side end faces thereof coincide with each other and positionings of the base tape 72 in the thickness direction is correctly carried out similar to the example shown in FIG. 6A and FIG. 6B.

As has been explained above, the carrier tape shown in FIG. 4A through FIG. 7B is previously provided with the first connecting portion and the second connecting portion connectable to each other at the end portion on one side and the end portion on the other side of the base tape constituting the carrier tape, and is further provided with the alignment means for positioning the first connecting portion and the second connecting portion in the longitudinal direction, the width direction and the thickness direction of the base tape and the holding means for holding the first connecting portion and the second connecting portion to each other.

Thereby, in the tape splicing operation for connecting the new carrier tape to the tail portion of the carrier tape mounted to the tape feeder, by connecting the first connecting portion and the second connecting portion, the first connecting portion and the second connecting portion can be positioned in the longitudinal direction, the width direction and the thickness direction of the base tape and the first connecting portion and the second connecting portion can be held to each other. Therefore, the mounted carrier tape and the new carrier tape can be connected swiftly by simple operation without using an exclusive connecting jig.

Further, the invention is not limited to the respective examples shown in the embodiment but, for example, the shape of the cutout portion 21 and the chipped off portion 22 shown in FIG. 4A and FIG. 4B may be shapes other than the shape of the circular spoon shown in FIG. 4A and FIG. 4B so far as the shape is a shape which is convenient for fitting together and can realize an excellent locking state by fitting.

Figure 10A:
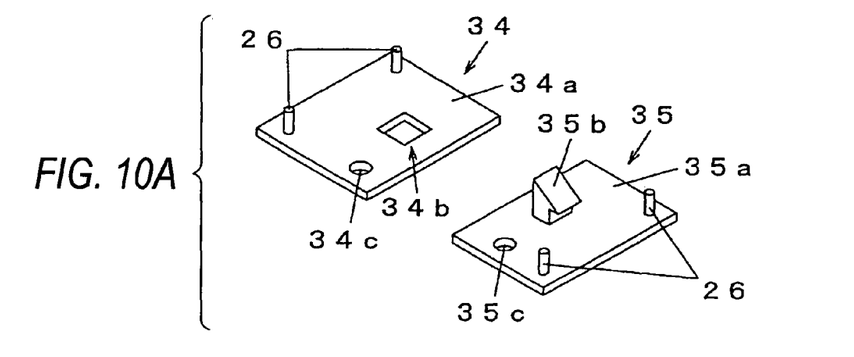
FIG. 10A, FIG. 10B and FIG. 10C illustrate perspective views of attachments used for connecting the electronic part supplying tape according to the embodiment of the invention.
Figure 10B:
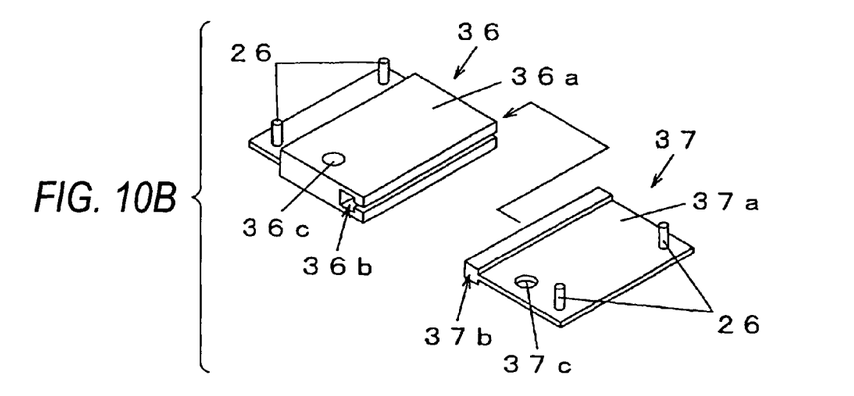
Figure 10C:
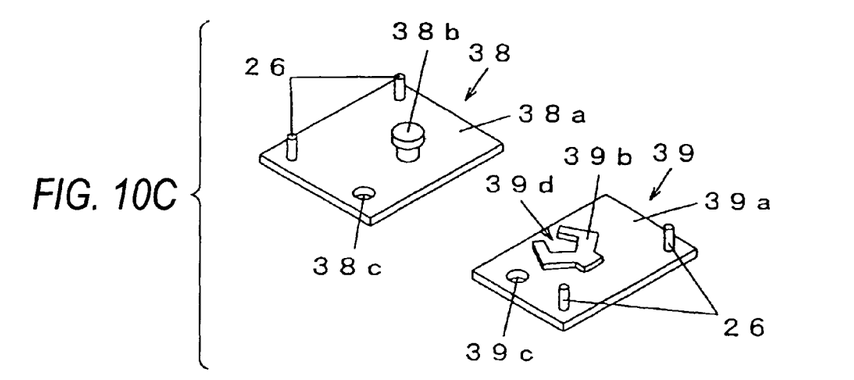

Further, in place of the attachments 25 and 24 shown in FIG. 5A and FIG. 5B, combinations of attachments shown in respective drawings of FIG. 10A, FIG. 10B and FIG. 10C may be used. All of the attachments are of a type of being coupled to the base tape by the pin 26 and respectively provided with feed holes in correspondence with the feed holes 25c and 24c of the attachments 25 and 24.

Attachments 34 and 35 shown in FIG. 10A are provided with an engaging hole in a quadrangular shape and an engaging hook 35b at plate-like portions 34a and 35a. When the attachments 34 and 35 are connected to each other, by inserting the engaging hook 35b to the engaging hole 34b from a lower side, positioning and holding to each other are carried out.

According to attachments 36 and 37 shown in FIG. 10B, an engaging slit 36b is attached to a thick plate 36a of the attachment 36 in the horizontal direction and an engaging end portion 37b to be engaged with the slit 36b is provided at a front end portion of a plate-like portion 37a of the attachment 37. When the attachments 36 and 37 are connected to each other, by sliding the engaging end portion 37b to the slit 36b from a transverse direction to engage, positioning and holding to each other are carried out. When the various attachments shown in FIG. 10A, FIG. 10B and FIG. 10C is applied to a carrier tape having an embossed portion, a notched portion (refer to FIG. 8B and FIG. 8C) for preventing interference with the embossed portion may be provided.

According to attachments 38 and 39 shown in FIG. 10C, an engaging pin 38b and an engaging hook 39b are provided respective to plate-like portions 38a and 39a. The engaging hook 39b is constituted by a shape having an opening portion 39d capable of enlarging an opening by elasticity. When the attachments 38 and 39 are connected to each other, by pressing the engaging pin 38b to the engaging hook 39b and forcibly pushing to widen the opening portion 39d to engage with the engaging hook 39b, positioning and holding to each other are carried out.

Figure 11A:
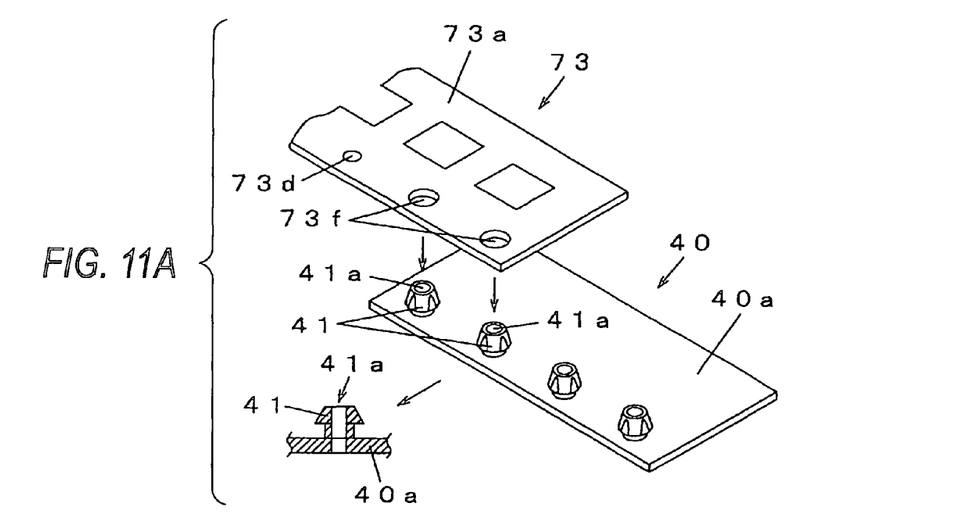
FIG. 11A and FIG. 11B are perspective views of an attachment used for connecting the electronic part supplying tape according to the embodiment of the invention.
Figure 11B:
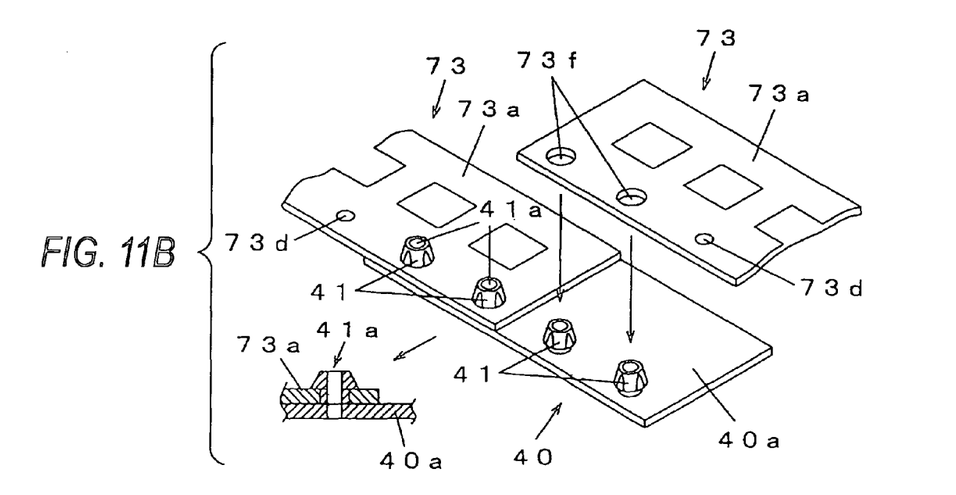

Further, FIG. 11A and FIG. 11B show an example of connecting two of carrier tapes by one sheet of attachment. In FIG. 11A, an attachment 40 constituting a locking member is constructed by a constitution in which a plurality of pieces (4 pieces in FIG. 11A and FIG. 11B) of perforated pins 41 are provided at a constant pitch (pitch of a feed hole 73d of a carrier tape 73 constituting an object) by a series arrangement along an edge portion of a plate-like portion 40a made of a resin. The perforated pin 41 is fixedly attached to the plate-like portion of a one touch fixing type by integral molding or bonding and the perforated pin 41 is provided with a through hole 41a penetrated in an up and down direction including the plate-like portion 40a with a hole diameter substantially equal to that of the feed hole 73d.

The attachment 40 is previously coupled only to an end portion of the carrier tape 73 on one side and the carrier tape 73 is supplied in this state. When the attachment 40 is coupled to the base tape 74, the hole diameter of a plurality of pieces (2 pieces in this case) of the feed holes 73d which are positioned at the end portion of the base tape is previously worked to enlarge to a hole diameter suitable for engaging the perforated pin 41 and the perforated pins 41 are engaged to enlarged holes 73f thereof.

Further, when two of the carrier tapes 73 are connected, the enlarged holes 73f are similarly provided to an end portion of the other of the carrier tape 73 constituting an object of connection and remaining ones of the perforated pins 41 on the attachment 40 are engaged to the enlarged holes 73f. Thereby, two of the carrier tapes 73 are positioned by way of the plurality of pieces of perforated pins 41 aligned on the attachment 40 at proper positions and held to each other by holding force of the perforated pin 41.

According to the above-described constitution, a first connecting portion is constituted by coupling the attachment 40 to the end portion of the carrier tape 73 constituting a tape-like member on one side by the enlarged hole 73f and a second connecting portion is constituted by the enlarged hole 73f which is a connecting-shape-formed portion provided for coupling the attachment 40 to the end portion of the carrier tape 73 on the other side. Further, the attachment 40 having the plurality of pieces of the perforated pins 41 arranged at proper positions constitutes alignment means for positioning.

In the respective examples shown in the embodiment, in combinations of paired attachments, a selection of which side is to be coupled to the tail side of the mounted carrier tape or which side is to be coupled to the head side of a new one of the carrier tape is arbitrary and the respective attachments may be coupled to a carrier tape on a side opposed to the carrier tape of the respective examples shown in FIG. 5A through FIG. 7B. Further, in combinations of the respective attachments, a combination of a side provided with a pin for engaging and a side provided with an engaging hole is similarly arbitrary and combinations reverse to those of the respective examples shown in FIG. 8A and FIG. 10C may be selected.

According to the invention, by connecting the first connecting portion provided at the end portion of one of the electronic part supplying tapes on one side and the second connecting portion provided at the end portion of other of the electronic part supplying tapes on the other side, the first connecting portion and the second connecting portion are positioned in the longitudinal direction, the width direction and the thickness direction of the tape-like member and the first connecting portion and the second connecting portion are held to each other and one of the electronic part supplying tapes and the other of the electronic supplying tapes can efficiently be connected without using a connecting jig.

What is claimed is:

1. An electronic part supplying tape, used in a tape feeder arranged in a part supplying portion of an electronic part mounting apparatus, for holding electronic parts on a tape member at a constant pitch and for supplying the electronic parts, comprising:

a first tape member with a first end portion and a second end portion, and a second tape member with a first end portion and a second end portion;

a first connecting portion formed on the second end portion of the first tape member;

a second connecting portion formed on the first end portion of the second tape member, to be connected to the first connecting portion formed on the first tape member;

an alignment means for positioning the first connecting portion and the second connecting portion in a longitudinal direction, a width direction and a thickness direction of the tape members, and a holding means for holding the first connecting portion and the second connecting portion to each other, wherein the first tape member and the second tape member are connectable by connecting the first connecting portion of the first tape member and the second connecting portion of the second tape member, wherein the first connecting portion of the first tape member comprises a locking member attachment coupled to the second end portion of the first tape member, and the second connecting portion of the second tape member comprises a locked member attachment coupled to the first end portion of the second tape member, wherein the locking member attachment and the locked member attachment constitute the alignment means, wherein each of said tape members having a plurality of recessed portions formed at the constant pitch for containing electronic parts and a plurality of feed holes formed at the constant pitch for feeding the tape member feed hole by feed hole in the tape feeder arrangement, and wherein said plurality of feed holes includes a locking member feed hole and a locked member feed hole are provided on the locking member attachment and the locked member attachment, respectively, and positioned so that the locking member feed hole and the locked member feed hole are overlapped in a state of engaging the locking member attachment to the locked member attachment and the overlapped hole and contiguous feed holes are arranged at the constant pitch.

2. A tape member attachment, used to connect two electronic part supplying tapes each having a plurality of recessed portions formed at a constant pitch for containing electronic parts and a plurality of feed holes formed at the constant pitch for feeding the tape feed hole by feed hole in a tape feeder arrangement in a part supplying portion of an electronic part mounting apparatus, comprising:

a locking member to be connected to an end portion of a first tape, and a locked member to be connected to an end portion of a second tape, said locking member comprising:

a plate portion, in correspondence to the width dimension of the first tape, an engaging member provided on a first end portion of the locking member plate portion, coupling means provided on a second end portion of the locking member plate portion for connecting the locking member to the end portion of the first tape, and said plurality of feed holes includes a locking member feed hole and a locked member feed hole provided on the locking member attachment and the locked member attachment, respectively, and positioned so that the locking member feed hole and the locked member feed hole are overlapped in a state of engaging the locking member attachment to the locked member attachment and the overlapped hole and contiguous feed holes are arranged at the constant pitch, and said locked member comprising:

a plate portion, in correspondence to the width dimension of the second tape, an engaging recess provided on a first end portion of the locked member plate portion for engaging with the engaging member of the locking member, coupling means provided on a second end portion of the locked member plate portion for connecting the locked member plate portion to the end portion of the second tape, and wherein said locked member is connected to said locked member by engaging said engaging member into said engaging recess, and wherein, when said locking member is connected to said first tape member and said locked member is connected to said second tape member, said first tape is connected to and aligned with said second tape in a longitudinal direction, a width direction and a thickness direction by engaging said engaging member into said engaging recess.

* * * * *